(12) United States Patent
Kugler

(10) Patent No.: US 7,927,913 B2
(45) Date of Patent: Apr. 19, 2011

(54) ELECTROLYTE PATTERN AND METHOD FOR MANUFACTURING AN ELECTROLYTE PATTERN

(75) Inventor: Thomas Kugler, Cambridgeshire (GB)

(73) Assignee: Seiko Epson Corporation, Tokyo (JP)

( * ) Notice: Subject to any disclaimer, the term of this patent is extended or adjusted under 35 U.S.C. 154(b) by 15 days.

(21) Appl. No.: 12/155,708

(22) Filed: Jun. 9, 2008

(65) Prior Publication Data
US 2009/0042346 A1 Feb. 12, 2009

(30) Foreign Application Priority Data

Jun. 8, 2007 (GB) .................................. 0711074.5

(51) Int. Cl.
H01L 51/40 (2006.01)

(52) U.S. Cl. ............ 438/99; 438/98; 438/642; 438/643; 257/40; 257/E39.007; 257/E51.011; 257/E51.013; 257/E51.015; 257/E51.001; 257/E51.002; 257/E51.004; 257/E51.005; 257/E51.006; 257/E51.007; 257/E51.01

(58) Field of Classification Search .................. 438/197, 438/98, 99, 642, 643; 257/40, E39.007, E51.001, 257/E51.002, E51.004, E51.005, E51.006, 257/E51.007, E51.01, 51.011, E51.013, E51.015
See application file for complete search history.

(56) References Cited

U.S. PATENT DOCUMENTS

| | | | |
|---|---|---|---|
| 2004/0096389 A1* | 5/2004 | Lobovsky et al. | 423/447.1 |
| 2005/0062097 A1* | 3/2005 | Misra et al. | 257/324 |
| 2005/0151820 A1* | 7/2005 | Sirringhaus et al. | 347/107 |
| 2006/0035154 A1* | 2/2006 | West et al. | 429/313 |
| 2006/0043432 A1 | 3/2006 | Kawai et al. | |
| 2006/0081849 A1* | 4/2006 | Lee et al. | 257/72 |
| 2006/0202289 A1 | 9/2006 | Armgarth et al. | |
| 2007/0138463 A1* | 6/2007 | Herlogsson et al. | 257/40 |

FOREIGN PATENT DOCUMENTS

| | | |
|---|---|---|
| SE | 0100748-3 C2 | 6/2003 |
| WO | WO 02/071505 A1 | 9/2002 |
| WO | WO 03/047009 A1 | 6/2003 |
| WO | WO 2005/095938 A1 | 10/2005 |

OTHER PUBLICATIONS

Taniguchi et al., "Vertical electrochemical transistor based on poly(3-hexylthiophene) and cyanoethylpullulan," *Applied Physics Letters*, vol. 85, No. 15, Oct. 11, 2004, pp. 3298-3300.

Chao et al., "Solid-State Microelectrochemistry: Electrical Characteristics of a Solid-State Microelectrochemical Transistor Based on Poly(3-methylthiophene)," *Journal of American Chemical Society*, vol. 109, No. 7, 1987, pp. 2197-2199.

Backlund et al., "Current modulation of a hygroscopic insulator organic field-effect transistor," *Applied Physics Letters*, vol. 85, No. 17, Oct. 25, 2004, pp. 3887-3889.

(Continued)

Primary Examiner — Benjamin P Sandvik
Assistant Examiner — Farid Khan
(74) Attorney, Agent, or Firm — Oliff & Berridge PLC

(57) ABSTRACT

A method for manufacturing a gel electrolyte pattern is disclosed, the method comprising depositing an electrolyte precursor by inkjet printing onto a gelling agent layer. A gel electrolyte pattern is also disclosed, the gel electrolyte pattern comprising either a mixture of a gelling agent and an electrolyte precursor or the products of a chemical reaction between a gelling agent and an electrolyte precursor.

13 Claims, 12 Drawing Sheets

OTHER PUBLICATIONS

Panzer et al., "Low-voltage operation of a pentacene field-effect transistor with a polymer electrolyte gate dielectric," *Applied Physics Letters*, vol. 86, 2005, pp. 103503-1-103503-3.

Said et al., "Polymer field-effect transistor gated via a poly(styrenesulfonic acid) thin film," *Applied Physics Letters*, vol. 89, 2006, pp. 143507-1-143507-3.

Wang et al., "High efficiency dye-sensitized nanocrystalline solar cells based on ionic liquid polymer gel electrolyte," *Chemical Communications*, 2002, pp. 2972-2973.

Seki et al., "Distinct Difference in Ionic Transport Behavior in Polymer Electrolytes Depending on the Matrix Polymers and Incorporated Salts," *Journal of Physical Chemistry B*, vol. 109, No. 9, 2005, pp. 3886-3892.

Wang et al., "Gelation of Ionic Liquid-Based Electrolytes with Silica Nanoparticles for Quasi-Solid-State Dye-Sensitized Solar Cells," *Journal of American Chemical Society*, vol. 125, No. 5, 2003, pp. 1166-1167.

Kubo et al., "Photocurrent-Determining Processes in Quasi-Solid-State Dye-Sensitized Solar Cells Using Ionic Gel Electrolytes," *Journal of Physical Chemistry B*, vol. 107, No. 18, 2003, pp. 4374-4381.

Kubo et al., "Quasi-solid-state dye-sensitized solar cells using room temperature molten salts and a low molecular weight gelator," *Chemical Communications*, 2002, pp. 374-375.

Klingshirn et al., "Gelation of Ionic Liquids Using a Cross-Linked Poly(Ethylene Glycol) Gel Matrix," *Chemical Materials*, vol. 16, No. 16, 2004, pp. 3091-3097.

* cited by examiner

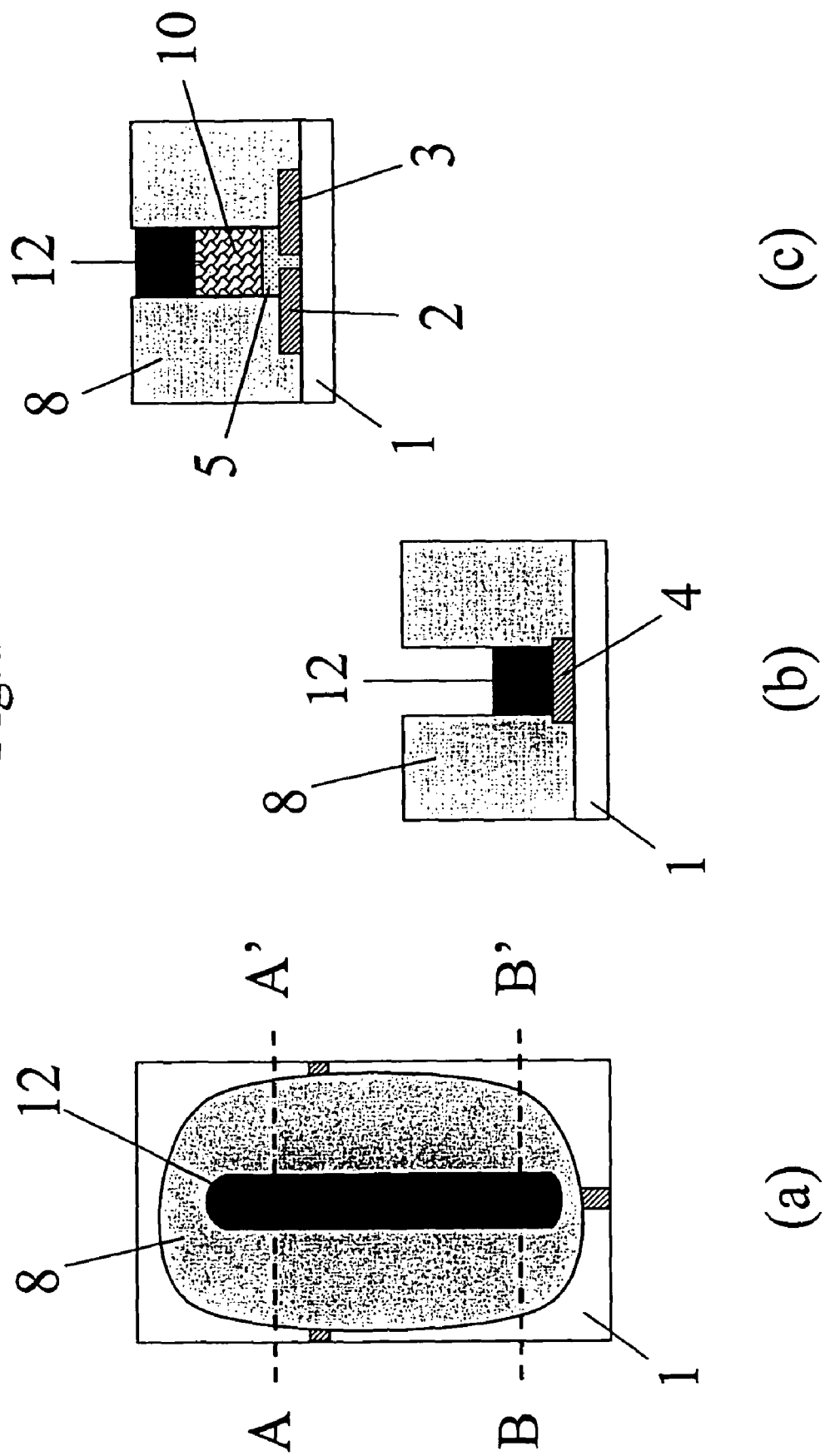

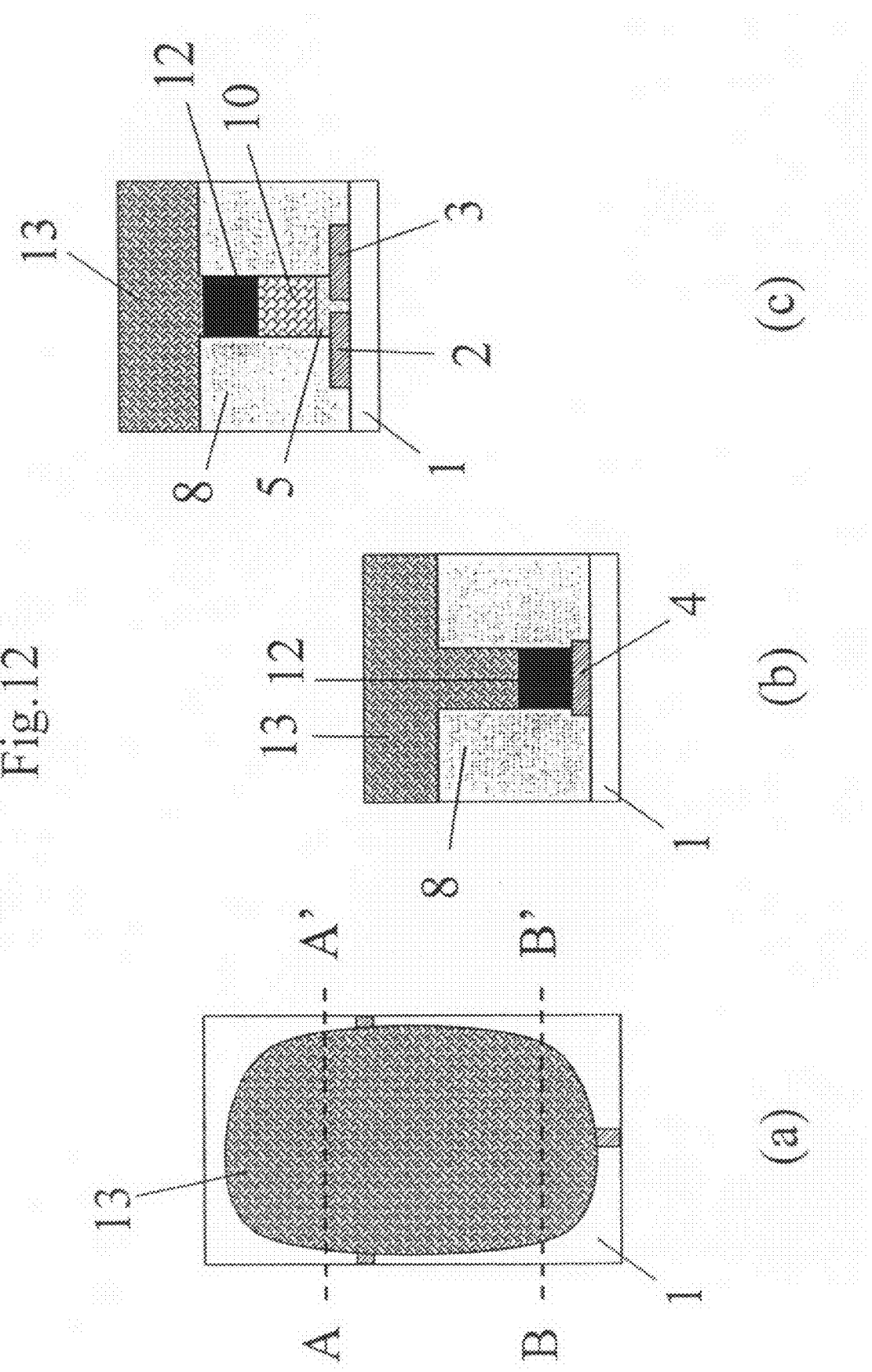

200
ELECTROLYTE PATTERN AND METHOD FOR MANUFACTURING AN ELECTROLYTE PATTERN

FIELD OF THE INVENTION

Several aspects of the present invention relate to a gel electrolyte pattern, particularly but not exclusively for use in a thin film transistor. The invention also relates to a method for manufacturing the gel electrolyte pattern.

BACKGROUND OF THE INVENTION

In electrochemical transistors (ECTs), the transistor channel is bridged by an electrochemically active, conducting polymer such as p-doped poly(3,4-ethylenedioxythiophene) poly(styrenesulfonate) (PEDOT-PSS). Adjacent to the conducting polymer layer, an electronically insulating but ionically conducting electrolyte layer in contact with a counter electrode ("gate electrode") allows an electric field to be applied to the electrochemically active material in the transistor channel, thereby changing its oxidation state. When the conducting polymer is reduced from the p-doped (conducting) to its neutral (semiconducting) form, its conductivity drops drastically.

ECTs based on conducting polymers that are stable in their p-doped state operate in a depletion mode. Prior to application of the gate voltage, the transistor is in an electrochemically stabilized ON-state where negatively charged counter-ions are present in the bulk of the conjugated polymer, balancing the positive charges on the polymer chains and thereby allowing for much higher charge carrier densities as compared to conventional organic field effect transistors (OFETs) in their ON-state. Due to this increased charge carrier density, ECTs can deliver much higher current levels than OFETs. Application of a positive gate voltage relative to the source contact switches the transistor channel from its initially p-doped ON-state to its electrochemically reduced OFF-state [see US 2006202289, WO 03047009, WO 02071505 and SE 0100748].

Another variant of ECTs is based on organic semiconductors that are stable in their neutral, non-doped state, i.e. the same organic semiconductor materials as are commonly used in OFETs [see T. Masateru and K. Tomoji, "Vertical electrochemical transistor based on poly(3-hexylthiophene) and cyanoethylpullulan", Appl. Phys. Lett. 85, 3298 (2004); S. Chao and M. S. Wrighton, "Solid State Microelectrochemistry: Electrical Characteristics of a Solid State Microelectrochemical Transistor Based on Poly(3-methylthiophene)", J. Am. Chem. Soc. 109, 6627 (1987); and T. G. Backlund, H. G. O. Sandberg, R. Österbacka, and H. Stubb, "Current modulation of a hygroscopic insulator organic field-effect transistor", Appl. Phys. Lett. 85, 3887 (2004)].

As in ECTs based on conducting polymers, the neutral organic semiconductor in the transistor channel is gated electrochemically with an electrolyte comprising mobile ions. However, these devices work in an accumulative mode, i.e. prior to the application of the gate voltage, the transistor is in its non-doped OFF-state. Applying a negative voltage to the gate (counter) electrode then results in electrochemical doping of the transistor channel so that the transistor is switched to its ON-state.

Both variants of ECTs have the benefit of operating at very small gate voltages. Typically, the gate voltage $|V_G|$ required to switch an ECT is around 0-2V. The electrochemical doping and de-doping processes of the material in the transistor channel are driven by the potential applied between the gate (counter) electrode and the polymer in the transistor channel (acting as the working electrode). In contrast to OFETs, where the electric field extends throughout the dielectric layer between the transistor channel and the gate electrode, the electric field in electrolyte-gated ECTs is confined to electrolytic double layer capacitances formed at the interfaces between the electrolyte and the transistor channel and between the electrolyte and the gate electrode. As the specific capacitance of the electrolytic double layers (of the order of $\mu F/cm^2$) is far larger than the specific capacitance in conventional OFETs (of the order of $nF/cm^2$), the gate voltages required for switching ECTs are much lower than those for OFETs [see M. J. Panzer, C. R. Newman, and C. D. Frisbie, "Low-voltage operation of a pentacene field-effect transistor with a polymer electrolyte gate dielectric", Appl. Phys. Lett. 86, 103503 (2005)].

A major disadvantage of ECTs is the fact that, in comparison to OFETs, their switching times are very long. This is due to the fact that in order to maintain charge neutrality, the electrochemical doping and de-doping of the transistor channel of an ECT requires both the exchange of counter-ions between the transistor channel and the electrolyte, and the diffusion of ions within the electrolyte, i.e. between the transistor channel and the gate electrode. The switching rate of ECTs therefore depends both on the mobility of the counter-ions within the transistor channel and on the ionic conductance of the electrolyte.

Recently, an electrolyte-gated field-effect transistor based on a p-type semiconducting polymer that is gated via a polyanionic proton conductor has been described [see E. Said et al., "Polymer field-effect transistor gated via a poly(styrenesulfonic acid) thin film", Appl. Phys. Lett. 89, 143507 (2006)]. Similarly to the ECTs based on semiconducting polymers described above, the application of a very small gate voltage (<1V) to this transistor is sufficient to result in the formation of large electrolytic double layer capacitances at the semiconductor-electrolyte and electrolyte-gate electrode interfaces, and hence the turning-on of the device.

In the above field-effect transistor gated via a polyanionic proton conductor, the electrolyte comprises only immobile polymeric anions that cannot diffuse into the bulk of the semiconductor layer. Thus, the rate limiting electrochemical doping and de-doping of the semiconductor layer that occurs in other ECTs is prevented. The device is therefore not an electrochemical device, but rather a field-effect transistor (FET) gated via an electrolyte. In combination with the high ionic conductivity of the proton conducting electrolyte, the prevention of electrochemical doping and de-doping allows the device to provide response times of the order of milliseconds and corresponding device operation in the kHz frequency range. The device retains the low driving voltages exhibited by ECTs.

Two major problems with electrolyte-gated transistors are their low operation frequencies and the occurrence of hysteresis during switching. The switching speed of an electrolyte-gated transistor depends on the rate of formation of the electrolytic double layer capacitance at the semiconductor-electrolyte interface, which is limited by the ionic conductance of the electrolyte between the transistor channel and the gate electrode. The ionic conductance of the electrolyte depends on the mobilities and the concentrations of the different ionic species present in the electrolyte. The ionic conductance also depends on the distance between the transistor channel and the gate electrode (i.e. the device geometry).

In the case of ECTs, an additional factor limiting the switching speed is the rate of diffusion of counter-ions into the bulk of the semiconductor material in the transistor channel.

A contributing factor to the occurrence of hysteresis during switching of both electrolyte-gated FETs and ECTs is the transient inhomogeneity of the electric field along the width of the transistor channel when a laterally positioned gate electrode is used.

Another problem with electrolyte-gated transistors is the leakage and diffusion of ions from the electrolyte into other device components. The performance of electric field-driven devices such as electrophoretic displays (EPDs) deteriorates in the presence of mobile ions, which results in ionic leakage currents and hysteresis effects. Therefore, great care has to be taken to encapsulate the electrolyte when electrolyte-gated transistors are used in a system including electric field-driven devices.

An additional problem with proton-conducting electrolytes, such as that used in the electrolyte-gated FET discussed above, is that they are highly acidic and therefore corrosive. The problem is exacerbated in liquid electrolytes, where leakage of the electrolyte may occur.

Finally, the stability of the electrolyte itself is a major problem for electrolyte-gated transistors in general. Both in ECTs and in electrolyte-gated FETs, the ionic conductivity of the electrolyte needs to be maintained at a constant level.

This requirement is difficult to fulfill because both water-based and solvent-based electrolytes are volatile. Due to their volatility, the electrolytes eventually dry out and hence their ionic conductivity decreases. Furthermore, in the case of non-aqueous electrolytes (e.g. solid polymeric electrolytes such as Li-salts dissolved in polyethylene oxide (PEO)) the ionic conductivity is often strongly dependent on trace amounts of residual water present in the electrolyte. Electrolytes are inherently polar and therefore tend to absorb water from the environment, i.e. electrolytes are hygroscopic.

Therefore, in addition to the loss of water or volatile organic solvents from the electrolyte, absorption of water from the environment by the electrolyte must be prevented in order to maintain a constant ionic conductivity.

SUMMARY OF THE INVENTION

According to a first aspect of the present invention, there is provided a method for manufacturing a gel electrolyte pattern comprising: depositing an electrolyte precursor by inkjet printing onto a gelling agent layer.

According to the method of the present invention, a liquid electrolyte precursor is deposited onto a gelling agent layer by inkjet printing. After this deposition step, the electrolyte precursor interacts with the gelling agent and forms a mechanically stable gel electrolyte pattern. In this way, the method allows a gel electrolyte pattern to be formed by inkjet printing a liquid material, which is much easier than depositing a gel material directly. In addition to preventing leakage, the gelling of the electrolyte allows other layers such as a gate electrode to be deposited on top of the electrolyte layer without the risk of creating short circuits with layers beneath the gel electrolyte pattern.

Preferably, the gelling agent layer is a patterned film. Suitably, the gel electrolyte pattern is formed on a surface energy pattern. Preferably, the surface energy pattern is stable against the electrolyte precursor.

Preferably, the gelling agent layer comprises a small molecule material or a polymer material. Conveniently, the gelling agent layer comprises PVDF-HFP or PMMA.

Suitably, the gelling agent layer comprises nano-particles. Preferably, the gelling agent layer comprises $SiO_2$ nano-particles.

Preferably the electrolyte precursor comprises an ionic liquid.

Suitably, the electrolyte precursor dissolves or disperses the gelling agent layer.

Preferably, there is provided a method as described above for manufacturing a transistor, comprising: depositing a source electrode and a drain electrode on an upper surface of a substrate such that the electrodes are separated from each other; forming a semiconductor layer over the substrate, the semiconductor layer being in contact with the source and drain electrodes; forming the gelling agent layer, which comprises a gelling agent, on the semiconductor layer; depositing the liquid electrolyte precursor onto the gelling agent layer, wherein the gelling agent and the electrolyte precursor are selected such that the electrolyte precursor interacts with the gelling agent to form the gel electrolyte pattern; and forming a gate electrode positioned such that the gate electrode is in contact with the gel electrolyte pattern and is separated from the source electrode, the drain electrode and the semiconductor layer.

In one embodiment, the step of forming the gelling agent layer comprises a step of depositing an unpatterned gelling agent layer onto the semiconductor layer, the method further comprising a step of patterning the semiconductor layer and the unpatterned gelling agent layer.

Preferably, the step of patterning comprises depositing an etch mask over the unpatterned gelling agent layer and etching the unpatterned gelling agent layer and the semiconductor layer.

Suitably, the method further comprises a step of removing the etch mask after the step of patterning.

Preferably, the method further comprises: depositing a bank layer so as to cover the gelling agent layer and forming a window through the bank layer, the window extending over at least part of the gelling agent layer, before the step of depositing the electrolyte precursor; wherein the electrolyte precursor is deposited into the window.

Conveniently, the step of depositing the source electrode and the drain electrode further comprises depositing a gate electrode base on the upper surface of the substrate, the gate electrode base being separated from the source and drain electrodes; wherein the bank layer is deposited so as to cover at least part of the gate electrode base and the window extends over at least part of the gate electrode base; and wherein the step of forming the gate electrode comprises depositing a gate electrode extension into the window, the gate electrode extension extending from an upper surface of the gate electrode base to an upper surface of the gel electrolyte pattern.

Preferably, the gate electrode extension is deposited by inkjet printing.

In one embodiment, the etch mask is removed in the step of forming the window. Preferably, the etch mask and the bank layer consist of the same material.

Suitably, the method further comprises a step of depositing an encapsulating layer over the window so as to seal the window after the electrolyte precursor is deposited.

Preferably, the encapsulating layer and the bank layer consist of the same material.

According to a second aspect of the present invention, there is provided a gel electrolyte pattern comprising: a mixture of a gelling agent and an electrolyte precursor.

According to a third aspect of the present invention, there is provided a gel electrolyte pattern comprising: the products of a chemical reaction between a gelling agent and an electrolyte precursor.

The gel electrolyte patterns according to the present invention can be manufactured simply by depositing an electrolyte precursor, which is typically a liquid material, onto a gelling agent. This process is easier to perform than a process involving depositing a gel electrolyte directly, particularly when used in the manufacture of a device such as an electrochemical transistor or an electrochromic display.

Preferably, there is provided a transistor comprising a gel electrolyte pattern as described above, the transistor further comprising: a substrate; source and drain electrodes disposed on an upper surface of the substrate, the source and drain electrodes being separated from each other; a semiconductor layer disposed over the substrate, the semiconductor layer being in contact with at least parts of the source and drain electrodes; and a bank layer disposed over the electrodes and the semiconductor layer, wherein a window is formed through the bank layer over at least part of an upper surface of the semiconductor layer; wherein the gel electrolyte pattern is disposed on the upper surface of the semiconductor layer in the window of the bank layer; and wherein the transistor further includes a gate electrode disposed in contact with the gel electrolyte pattern and separated from the source electrode, the drain electrode and the semiconductor layer.

Due to the use of a gel electrolyte pattern and the presence of the bank layer in the transistor described above, the risk of the electrolyte leaking and causing damage to other nearby components is greatly reduced. The use of a gel electrolyte pattern also allows other layers such as a gate electrode to be deposited on top of the electrolyte layer without the risk of creating short circuits with the semiconductor in the transistor channel. In addition, since the transistor structure of the present invention has a gel electrolyte layer confined to a window in a bank layer, i.e. a gel electrolyte pattern, the size of the electrolyte layer can be precisely controlled.

Preferably, the transistor comprises an encapsulation layer sealing the window of the bank layer so as to enclose the gel electrolyte pattern. This further prevents leakage of the electrolyte and the diffusion of ions out of the electrolyte. It also ensures a constant ionic conductivity in the electrolyte by preventing the exchange of water with the environment. The combination of a bank layer and an encapsulation layer provides an efficient containment of the electrolyte and thereby prevents leakage and the diffusion of ions.

Preferably, the gate electrode comprises a gate electrode base disposed on the upper surface of the substrate and a gate electrode extension extending from the gate electrode base to an upper surface of the gel electrolyte pattern. Alternatively, the gate electrode is disposed on an upper surface of the gel electrolyte pattern.

The transistor structure according this embodiment increases the switching speed of the transistor and minimizes the occurrence of hysteresis during switching. In the electrolyte-gated transistor of this embodiment, the electrolyte layer is sandwiched vertically between the transistor channel and a top-gate electrode. This geometry has two advantages over a structure having a laterally positioned gate electrode. Firstly, the distance between the gate electrode and the transistor channel is minimized, which maximizes the ionic conductance between the transistor channel and the gate electrode and therefore allows fast switching speeds. Secondly, since the gate electrode is positioned directly above the transistor channel rather than to one side of it, the electric field is more uniform across the width of the transistor channel in the transistor according to the invention than in a transistor having a lateral gate electrode structure. This reduces hysteresis during switching of the transistor.

Preferably, each of the bank layer and the encapsulating layer comprises a barrier material which is substantially impermeable to at least one of water and organic solvent molecules.

In one embodiment, the transistor is an electrolyte-gated field effect transistor. Preferably, the gel electrolyte pattern is based on a polymeric ionic liquid analogue.

Alternatively, the transistor is an electrochemical transistor. Suitably, the gel electrolyte pattern is based on an ionic liquid.

BRIEF DESCRIPTION OF THE DRAWINGS

Embodiments of the present invention will now be described by way of further example only and with reference to the accompanying drawings, in which:

FIG. 11(a) shows a top view of an eleventh stage in manufacturing a transistor according to an embodiment of the present invention.

FIG. 11(b) shows a cross section along the line B-B' in FIG. 11(a).

FIG. 11(c) shows a cross section along the line A-A' in FIG. 11(a).

FIG. 12(a) shows a top view of a twelfth stage in manufacturing a transistor according to an embodiment of the present invention.

FIG. 12(b) shows a cross section along the line B-B' in FIG. 12(a).

FIG. 12(c) shows a cross section along the line A-A' in FIG. 12(a).

DETAILED DESCRIPTION

The following is a description of the preferred embodiment of the present invention, in which a gel electrolyte pattern according to the invention forms part of a transistor.

Figure 1:
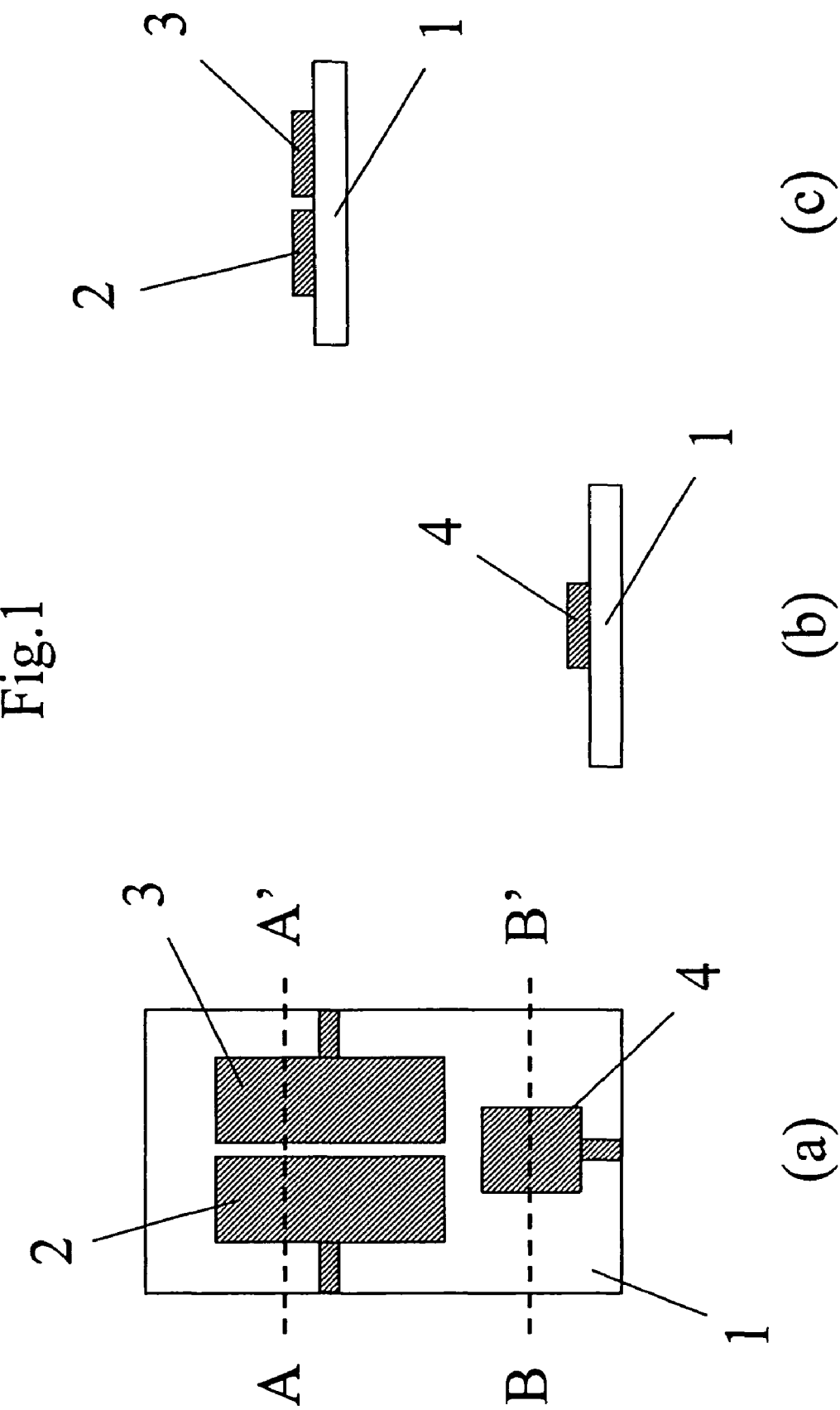
FIG. 1(a) shows a top view of a first stage in manufacturing a transistor according to an embodiment of the present invention.
FIG. 1(b) shows a cross section along the line B-B' in FIG. 1(a).
FIG. 1(c) shows a cross section along the line A-A' in FIG. 1(a).

FIG. 1 shows a top view (a) and two cross sections along the lines B-B' (b) and A-A' (c) of a first stage in manufacturing a transistor according to the embodiment. In a first manufacturing step, a source electrode 2, a drain electrode 3 and a gate electrode 4 are fabricated on an insulating substrate 1. The source electrode 2 and the drain electrode 3 are separated by a gap, which defines the transistor channel. The gate electrode 4 is positioned in close proximity to the source and drain electrodes.

The source, drain, and gate electrodes 2, 3, 4 are preferably made from an electrochemically inert material such as gold, platinum, palladium or a conductive form of carbon, in order to prevent electrochemical corrosion during operation whilst in contact with the electrolyte.

Figure 2:
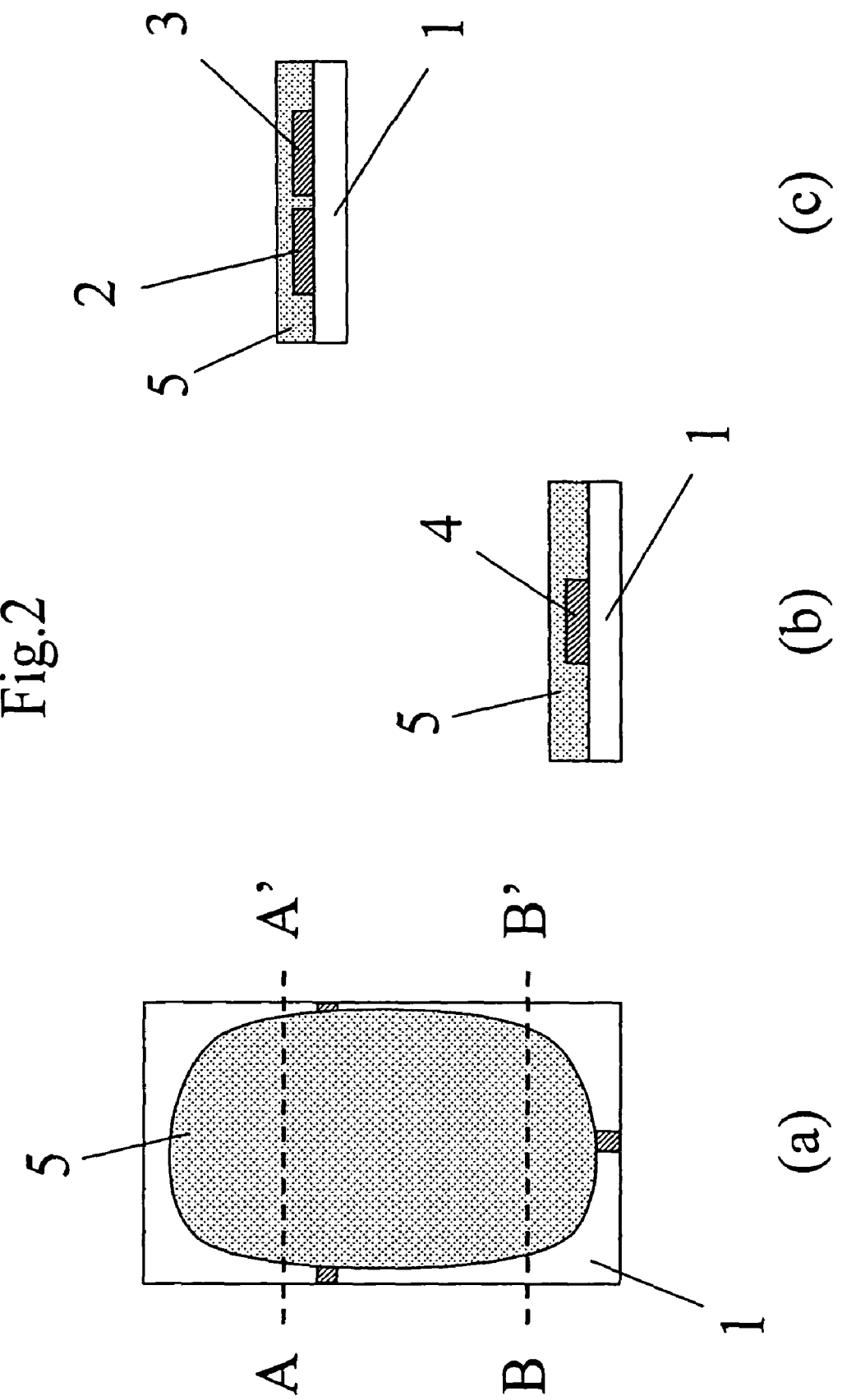
FIG. 2(a) shows a top view of a second stage in manufacturing a transistor according to an embodiment of the present invention.
FIG. 2(b) shows a cross section along the line B-B' in FIG. 2(a).
FIG. 2(c) shows a cross section along the line A-A' in FIG. 2(a).

FIG. 2 shows a top view (a) and two cross sections along the lines B-B' (b) and A-A' (c) of a second stage in manufacturing the transistor. FIG. 2 shows the device of FIG. 1 after a second manufacturing step, in which a thin semiconductor layer 5 is deposited so as to cover the source electrode 2, the drain electrode 3, and the gate electrode 4 on the insulating substrate 1.

The semiconductor material 5 may be p-type or n-type and may comprise a single or a combination of several semiconductor materials. For an electrochemical transistor (ECT), when a p-type semiconductor is used doping occurs anodically (i.e. by oxidation, resulting in hole conduction), and when an n-type semiconductor is used doping occurs cathodically (i.e. by reduction, resulting in electron conduction).

Furthermore, the semiconductor material 5 may be inorganic, metal-organic, or organic, and the semiconductor 5 may comprise small molecules, oligomers, or polymers.

The semiconductor 5 in the transistor channel may be a p-type organic semiconductor material comprising small molecules such as pentacene, phthalocyanine, tetrabenzoporphyrine, or (biphenyl)tetrathiafulvalene. Alternatively, the p-type organic semiconductor material may be an oligomer such as di-hexyl quaterthiophene, alpha-sexithiophene, a thiophene-phenylene oligomer, or a thiophene-thiazole oligomer. Also, the p-type organic semiconductor material may be a polymer such as poly[3-hexylthiophene] (P3HT), poly [5,5'-bis(3-dodecyl-2-thienyl)-2,2'-bithiophene] (PQT-12), or poly[9,9-dioctylfluorene-co-bithiophene] (ADS2008).

Other possible p-type semiconductor materials for the transistor include metal-organic complexes such as Cu-phthalocyanine, Mg-phthalocyanine, or Zn-phthalocyanine. Furthermore, such metal organic complexes may be oligomeric, as in Si-phthalocyanine or Ru-phthalocyanine, or even polymeric.

An inorganic p-type semiconductor material may be used, comprising a metal oxide such as silver oxide ($Ag_2O$), cuprous oxide ($Cu_2O$), cupric oxide (CuO) or zinc oxide (ZnO), or a perovskite such as $SrFe_yCo_{1-y}O_{2.5+x}$ (y=0.5), or $SrTi_{(0.8)}Fe_{(0.2)}O_{(3-\square)}$. Alternatively, the p-type semiconductor material may comprise a metal chalcogenide such as copper(I) sulphide ($Cu_2S$), copper(I) selenide ($Cu_2Se$), copper indium selenide $CuInSe_2$, or CIGS ($Cu(InGa)Se_2$).

Finally, a p-type semiconductor material in elemental form may be used, such as carbon nano-tubes (CNTs).

The semiconductor 5 in the transistor channel may be an n-type organic semiconductor material comprising small molecules such as perylenetetracarboxylicacid dianhydride (PTCDA), dimethylperylenetetracarboxylicacid diimide (MePTCDI), fullerene ($C_{60}$), $C_{60}$-fused pyrrolidine-meta-$C_{12}$ phenyl (C60MC12), or [6,6]-phenyl $C_{61}$-butyric acid methyl ester (PCBM). The n-type organic semiconductor material may also be oligomeric comprising thiazole oligomers with 4-trifluormethylphenyl groups, thiazole/thiophene co-oligomers with 4-trifluormethylphenyl groups, perfluoro-arene-capped oligothiophenes such as 5,5"-diperfluorophenyl-2,2':5',2":5",2'''-quaterthiophene, or perfluorinated phenylene dendrimers such as $C_{60}F_{42}$ or $C_{132}F_{90}$. Also, the n-type organic semiconductor material may be a polymer such as polybenzimidazobenzophenanthroline (BBL or poly [2-methoxy-5-(2'-ethylhexyloxy)-1,4-(1-cyanovinylene) phenylene (MEH-CN-PPV).

Other possible n-type semiconductor materials for the transistor include metal-organic complexes such as perfluoro-vanadyl-phthalocyanine, perfluoro-copper-phthalocyanine, tetrapyridotetraazaporphyrinato zinc(II) (TPyTAPZn), tris (8-quinolinolato)aluminium ($Alq_3$), tris (4-methyl-8-quinolinolato)aluminium ($Almq_3$), bis(10-hydroxybenzo[h]-quinolinato)beryllium ($BeBq_2$), bis(2-methyl-8-quinolinolato)-(4-hydroxy-biphenylyl)-aluminium (BAlq), bis[2-(2-hydroxypheyl)-benzoxazolato]zinc ($Zn(BOX)_2$), or bis[2-(2-hydroxypheyl)-benzothiazolato]zinc ($Zn(BTZ)_2$).

An inorganic n-type semiconductor material may also be used, comprising a metal oxide such as tungsten trioxide ($WO_3$), titanium dioxide ($TiO_2$), zinc oxide ($ZnO_2$), tin oxide ($SnO_2$) or indium tin oxide (ITO), or a metal chalcogenide such as cadmium sulphide (CdS) or cadmium selenide (CdSe).

Figure 3:
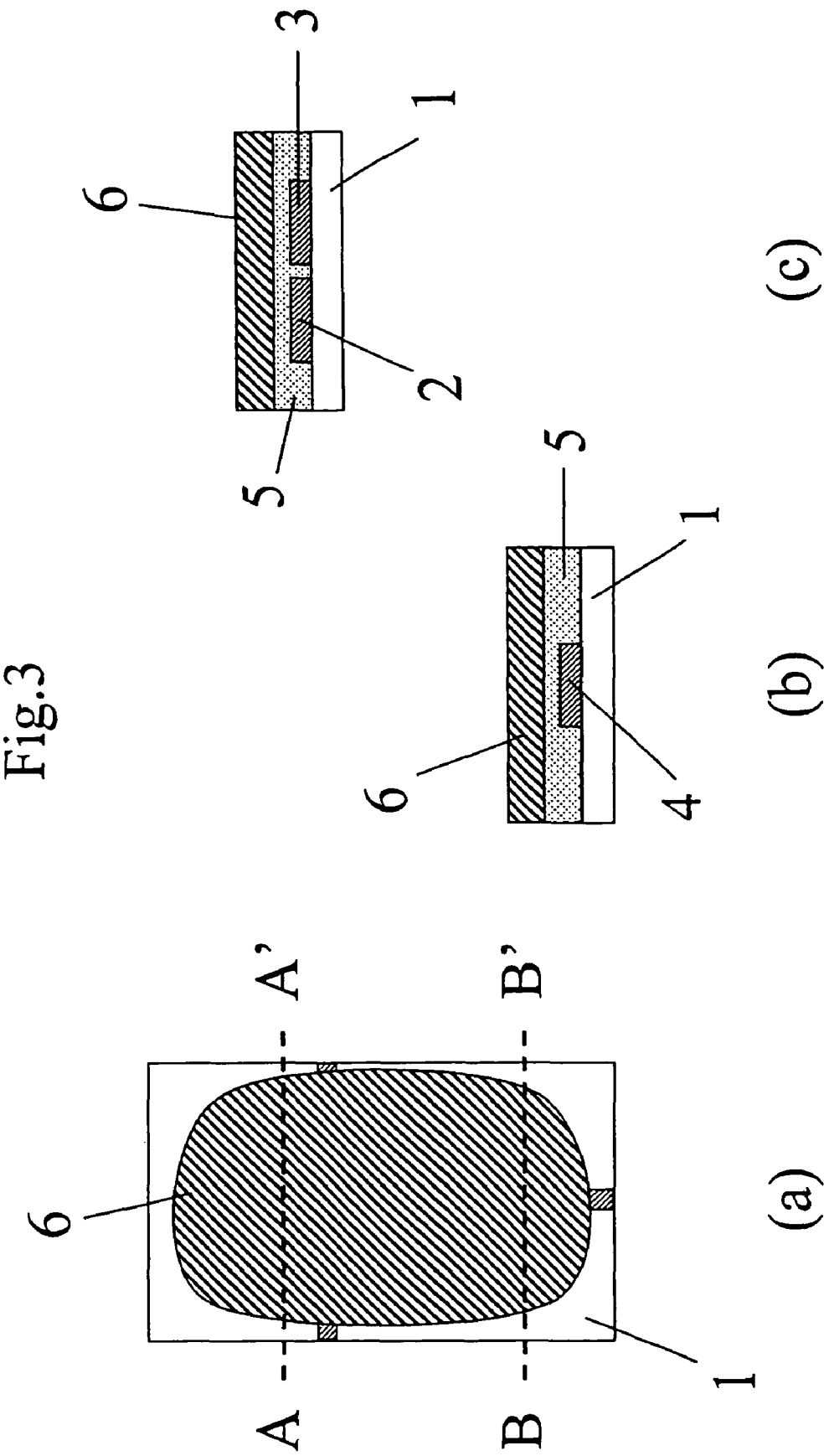
FIG. 3(a) shows a top view of a third stage in manufacturing a transistor according to an embodiment of the present invention.
FIG. 3(b) shows a cross section along the line B-B' in FIG. 3(a).
FIG. 3(c) shows a cross section along the line A-A' in FIG. 3(a).

FIG. 3 shows a top view (a) and two cross sections along the lines B-B' (b) and A-A' (c) of a third stage in manufacturing the transistor. FIG. 3 shows the device of FIG. 2 after a third manufacturing step, in which a gelling agent layer 6 is deposited onto the semiconductor layer 5 over the electrodes 2, 3, 4.

In this embodiment of the invention, a gelled electrolyte 10 is deposited by inkjet printing a liquid electrolyte precursor 9 on top of a pattern of a gelling agent 6. After the deposition step, the gelling agent 6 interacts with the electrolyte precursor 9 and forms a pattern of a gelled electrolyte 10. Hence the material for the gelling agent layer 6 must be chosen to be compatible with the electrolyte precursor 9 used, so as to eventually form the desired gelled electrolyte 10.

Electrolytes based on ionic liquids can be gelled by using polymeric additives. An example is the gelling of 1-methyl-3-propylimidazolium iodide by addition of poly(vinylidene-fluoride-co-hexafluoropropylene) (PVDF-HFP) [see "High efficiency dye-sensitized nanocrystalline solar cells based on ionic liquid polymer gel electrolyte", P. Wang, S. M. Zakeeruddin, I. Exnar, and M. Grätzel; Chem. Commun. 2002, 2972-2973]. Thus, these two materials offer one possible combination of gelling agent 6 and electrolyte precursor 9 in the method of the present invention.

Another possible combination of materials is 1-ethyl-3-methylimidazolium bis(trifluoromethanesulfonyl)imide (EMI-TFSI) as an electrolyte precursor 9 and poly(methyl methacrylate) (PMMA) as a gelling agent 6. EMI-TFSI can be gelled by being incorporated into a PMMA network. The resulting PMMA/EMI-TFSI gel electrolyte is a completely amorphous, single-phase material with an ionic conductivity in the range of $10^{-7}$ S/cm even for high concentrations of PMMA [see "Distinct Difference in Ionic Transport Behavior in Polymer Electrolytes Depending on the Matrix Polymers and Incorporated Salts", S. Seki, M. A. B. H. Susan, T. Kaneko, H. Tokuda, A. Noda, and M. Watanabe, J. Phys. Chem. B 109, 3886 (2005)].

Alternatively, an ionic liquid may be used as an electrolyte precursor 9 with inorganic nano-particles as a gelling agent 6. An example is the preparation of ionic liquid-based quasi-solid-state electrolytes, previously described in relation to dye-sensitized solar cells (DSSC) [see "Gelation of Ionic Liquid-Based Electrolytes with Silica Nanoparticles for Quasi-Solid-State Dye-Sensitized Solar Cells", P. Wang, S. M. Zakeeruddin, P. Comte, I. Exnar, and M. Gratzel, J. Am. Chem. Soc. 125, 1166 (2003)]. Furthermore, a low-molecular weight organic gelling agent may be used in the gelling agent layer 6 of the invention to form a quasi-solid-state electrolyte, with an ionic liquid such as 1-hexyl-3-methylimidazolium iodide as the electrolyte precursor 9 [see "Photocurrent-Determining Processes in Quasi-Solid-State Dye-Sensitized Solar Cells Using Ionic Gel Electrolytes", W. Kubo, S. Kambe, S, Nakade, T. Kitamura, K. Hanabusa, Y. Wada, and S. Yanagida, J. Phys. Chem. B 107, 4374 (2003); and "Quasi-solid-state dye-sensitized solar cells using room temperature molten salts and a low molecular weight gelator", W. Kubo, T. Kitamura, K. Hanabusa, Y. Wada, and S. Yanagida, Chem. Commun., 2002, 374].

The gelling of ionic liquid-based electrolytes may also be achieved by chemical cross-linking reactions. For example, the hydrophobic ionic liquid 1-hexyl-3-methylimidazolium bis(trifluoromethanesulfonyl)imide may be used as the electrolyte precursor 9, and may be gelled by the cross-linking of disuccinimidylpropyl PEG monomers with four-arm tetraamine PEG cross-linkers during the manufacturing method of the present invention [see "Gelation of Ionic Liquids Using a Cross-Linked Poly(Ethylene Glycol) Gel Matrix", M. A. Klingshirn, S. K. Spear, R. Subramanian, J. D. Holbrey, J. G. Huddleston, and R. D. Rogers, Chem. Mater. 16, 3091 (2004)].

Figure 4:
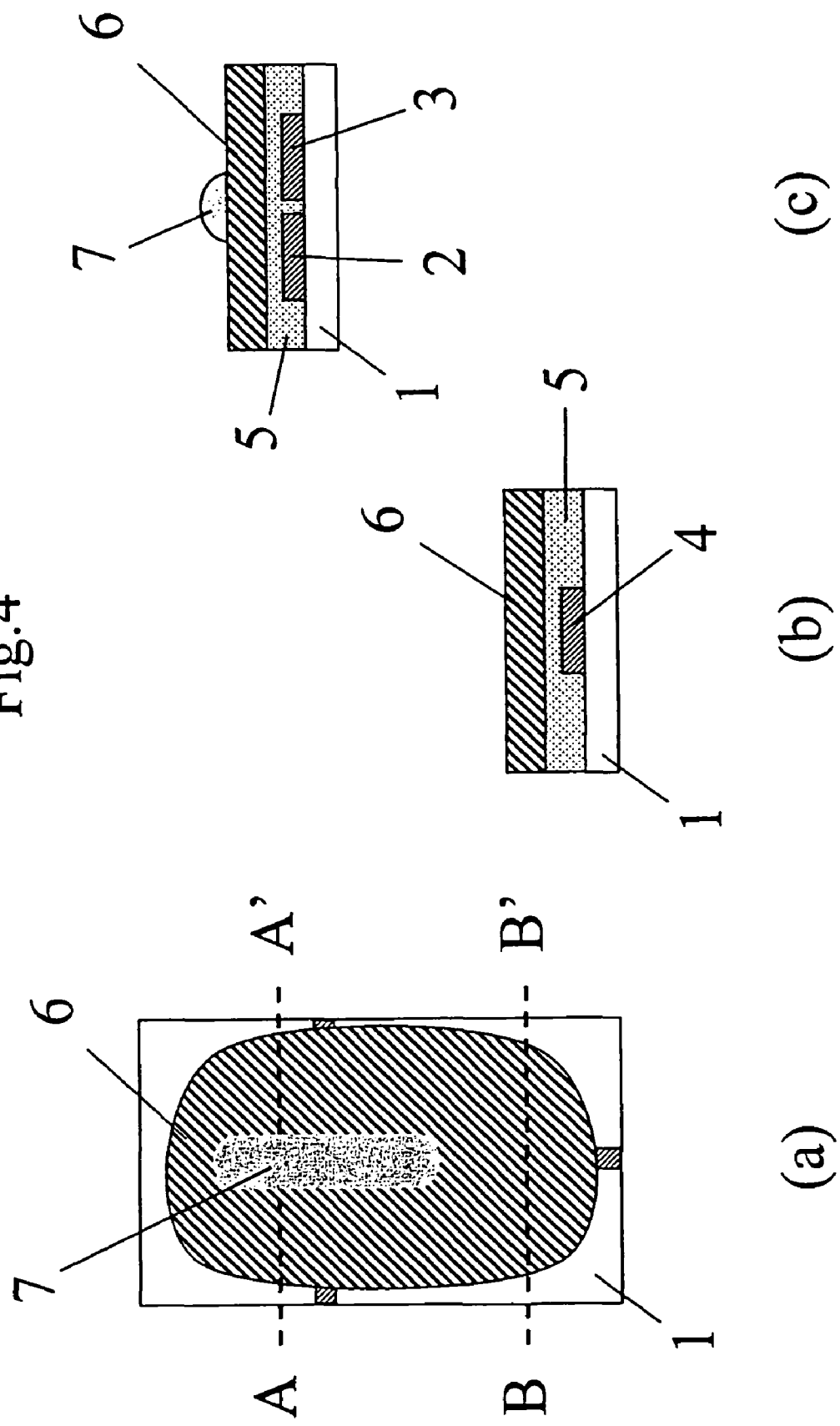
FIG. 4(a) shows a top view of a fourth stage in manufacturing a transistor according to an embodiment of the present invention.
FIG. 4(b) shows a cross section along the line B-B' in FIG. 4(a).
FIG. 4(c) shows a cross section along the line A-A' in FIG. 4(a).

FIG. 4 shows a top view (a) and two cross sections along the lines B-B' (b) and A-A' (c) of a fourth stage in manufacturing the transistor. FIG. 4 shows the device of FIG. 3 after a third manufacturing step, in which an etch mask pattern 7 is inkjet printed onto the gelling agent 6, on top of the transistor channel defined by the source 2 and drain 3 electrodes.

The purpose of the inkjet printed etch mask 7 is to allow patterning of the bi-layer comprising the semiconductor material 5 and the gelling agent layer 6.

When inkjet printing is used to deposit the etch mask 7, the material for the etch mask 7 must be formulated into an ink that is printable onto the gelling agent layer 6. This requires an appropriated choice of solvents and material concentrations (resulting in an appropriate viscosity and surface tension) in order to enable good ink ejection, wetting of the surface of the gelling agent layer 6, and drying.

Another requirement for the choice of etch mask is that its etch rate must be slow compared to the etch rate of the gelling agent 6 and semiconductor 5 layers.

Where an organic polymer-based gelling agent such as PMMA is used for the gelling agent layer 6, and an organic semiconductor such as poly[9,9-dioctylfluorene-co-bithiophene] (ADS2008) is used for the semiconductor layer 5, oxygen plasma is an appropriated etching method. In this case, the perfluorinated polymer CYTOP (as supplied by Asahi Glass Inc., Japan) may be used as the etch mask 7, as it displays much slower etch rates in oxygen plasma than the bi-layer composed of PMMA and ADS2008.

Another possibility for the etch mask 7 when oxygen plasma patterning is used is the sulfur-rich conducting polymer poly(3,4-ethylenedioxythiophene) poly(styrenesulfonate) (PEDOT-PSS), which displays a very slow etch rate in oxygen plasma.

Figure 5:
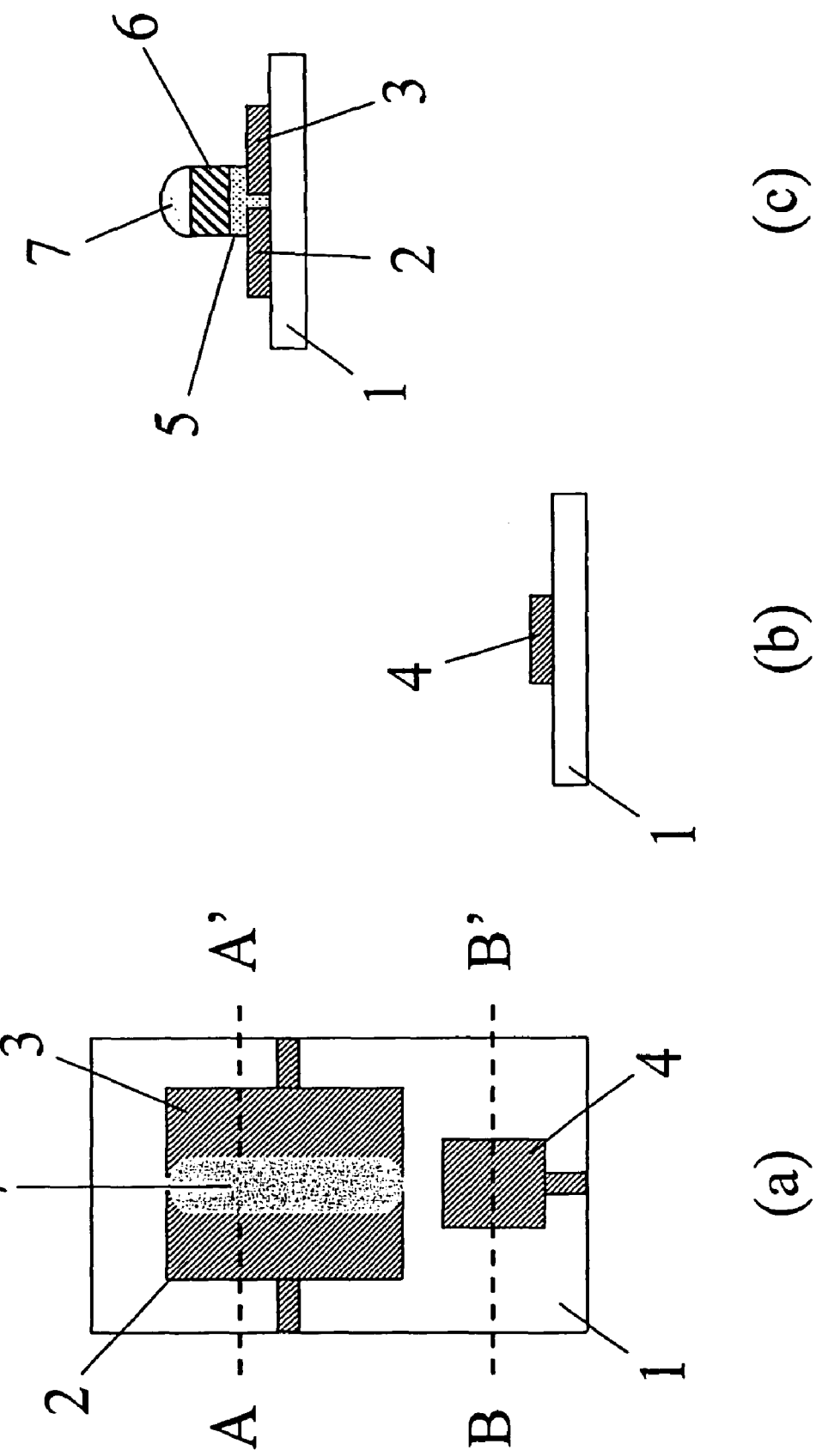
FIG. 5(a) shows a top view of a fifth stage in manufacturing a transistor according to an embodiment of the present invention.
FIG. 5(b) shows a cross section along the line B-B' in FIG. 5(a).
FIG. 5(c) shows a cross section along the line A-A' in FIG. 5(a).

FIG. 5 shows a top view (a) and two cross sections along the lines B-B' (b) and A-A' (c) of a fifth stage in manufacturing the transistor. FIG. 5 shows the device of FIG. 4 after a fifth manufacturing step, in which pattern transfer is performed using an oxygen plasma treatment. The gelling agent layer 6 and the semiconductor layer 5 are removed everywhere except in those areas that are covered by the etch mask 7.

Where inorganic gelling agents 6 or semiconductors 5 are used in the transistor, oxygen plasma may be inappropriate as etching method. Alternative etching methods can be used, including wet-chemical etching processes based on HF or other acids.

Figure 6:
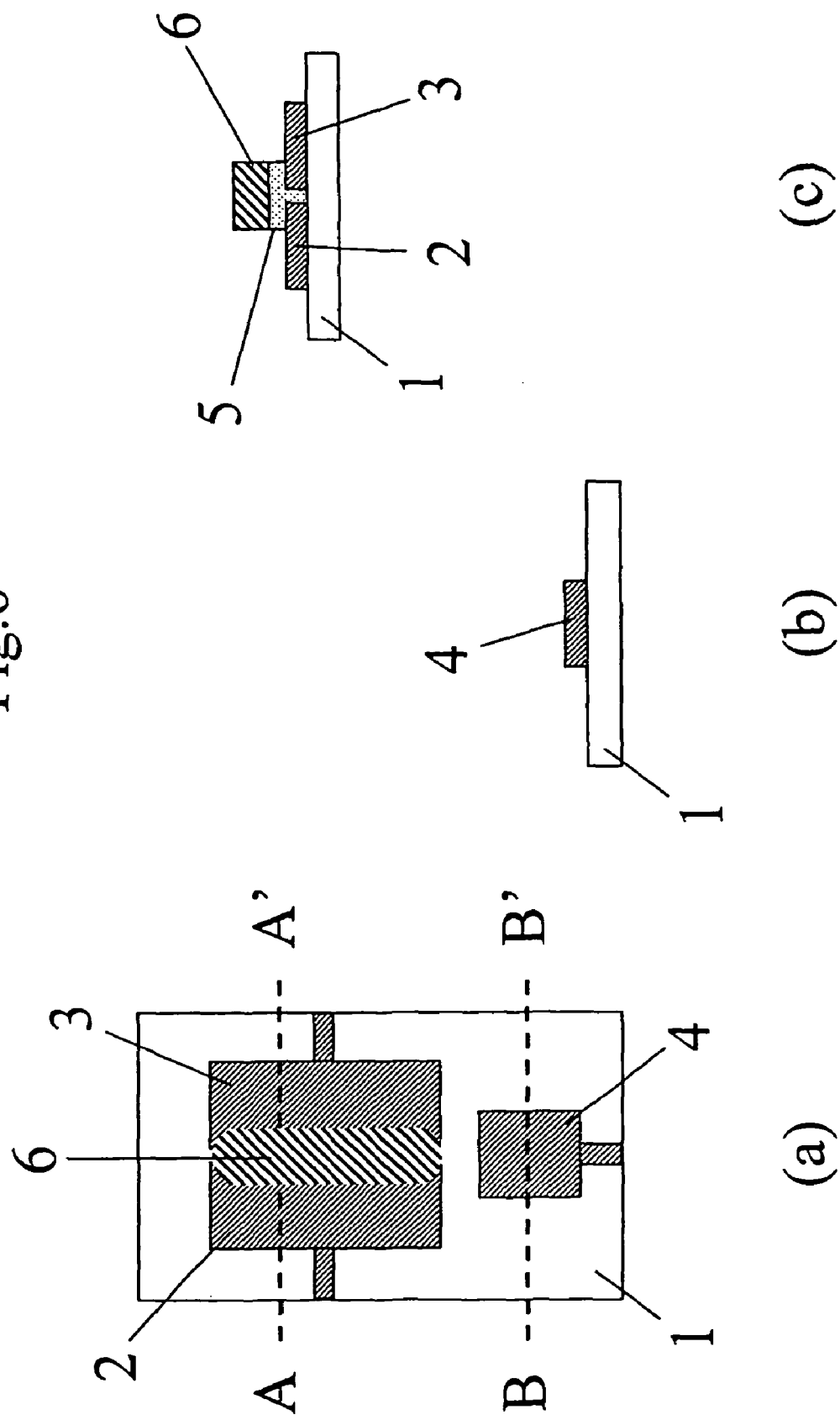
FIG. 6(a) shows a top view of a sixth stage in manufacturing a transistor according to an embodiment of the present invention.
FIG. 6(b) shows a cross section along the line B-B' in FIG. 6(a).
FIG. 6(c) shows a cross section along the line A-A' in FIG. 6(a).

FIG. 6 shows a top view (a) and two cross sections along the lines B-B' (b) and A-A' (c) of a sixth stage in manufacturing the transistor. FIG. 6 shows the device of FIG. 5 after a sixth manufacturing step, in which the inkjet printed etch mask 7 is removed. As shown in FIG. 6(c), a bi-layer pattern comprising the gelling agent 6 and the semiconductor 5 covers the transistor channel defined by the source 2 and drain 3 electrodes.

Figure 7:
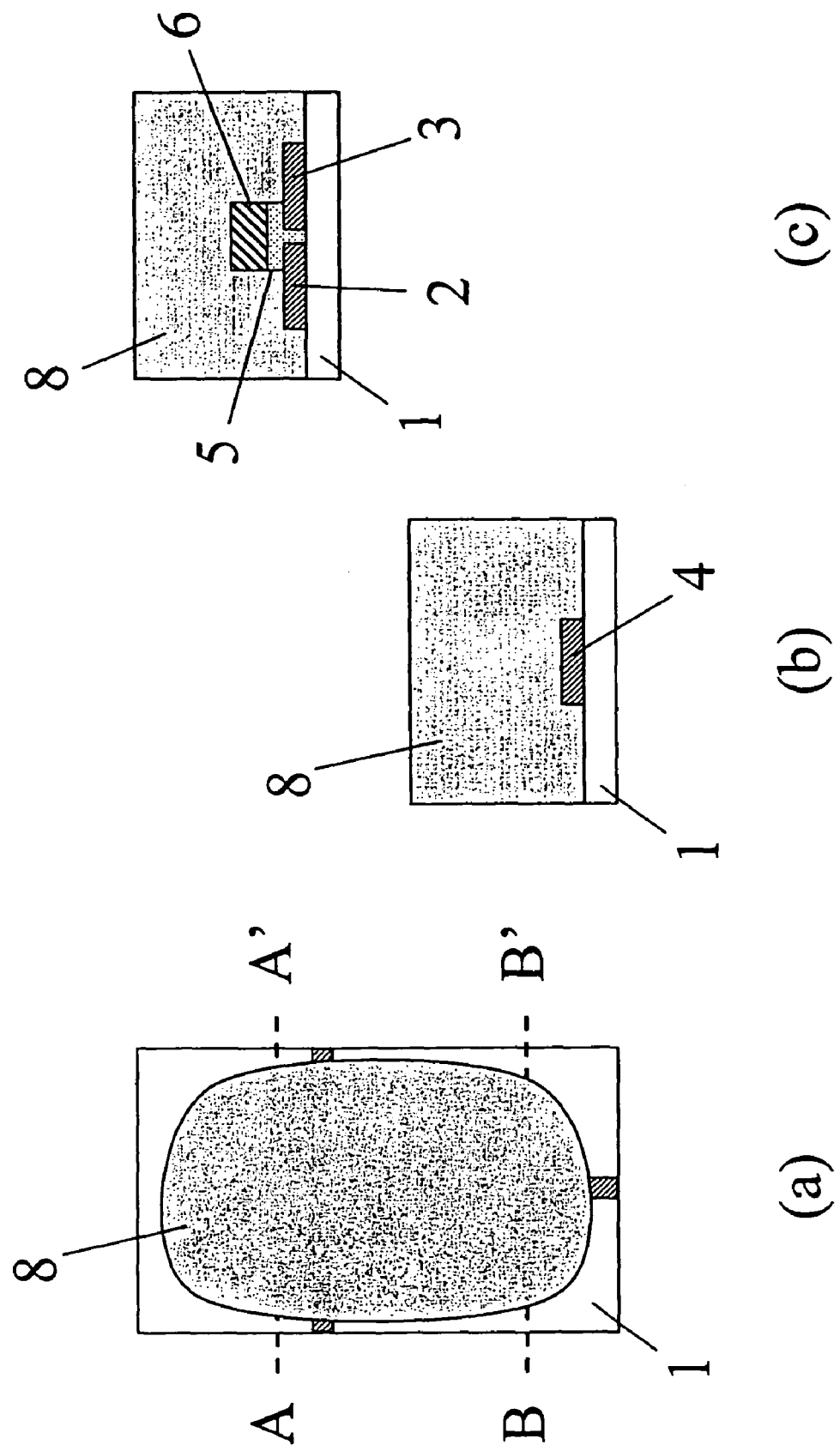
FIG. 7(a) shows a top view of a seventh stage in manufacturing a transistor according to an embodiment of the present invention.
FIG. 7(b) shows a cross section along the line B-B' in FIG. 7(a).
FIG. 7(c) shows a cross section along the line A-A' in FIG. 7(a).

FIG. 7 shows a top view (a) and two cross sections along the lines B-B' (b) and A-A' (c) of a seventh stage in manufacturing the transistor. FIG. 7 shows the device of FIG. 6 after a seventh manufacturing step, in which a bank material 8 is deposited over the structure of FIG. 6.

One purpose of the bank 8 is to prevent leakage by enclosing the electrolyte 10, which is particularly important where the electrolyte 10 is a liquid. The bank 8 also prevents diffusion of ions from the electrolyte 10 to other device components.

Another purpose of the bank 8 is to enclose volatile components of the electrolyte 10 such as water (in the case of water-based electrolytes), or organic solvents (in the case of organic solvent-based electrolytes) in order to prevent the electrolyte 10 drying out, thereby maintaining the ionic conductivity of the electrolyte 10 at a constant level.

A further purpose of the bank 8 is to prevent the absorption of humidity (i.e. water) from the environment when a hygroscopic electrolyte 10 is used, again in order to maintain a constant ionic conductivity.

The bank material 8 should therefore be insoluble in the electrolyte 10 and non-polar in order to prevent ion diffusion. The bank material 8 should also have extremely small diffusion coefficients for ions and water molecules. Possible bank materials include the fluoropolymer Cytop (supplied by Asahi Glass Inc., Japan) and the cycloolefin copolymer Zeonex (supplied by Zeon Corporation, Japan). Both Cytop and Zeonex are chemically resistant, display small dielectric constants (2.1 and 2.2-2.3, respectively), and absorb less than 0.01% water.

The removal of the etch mask 7 shown in FIG. 6 is not necessary if the etch mask 7 comprises a material that can be inkjet etched. Ideally, the etch mask 7 comprises the same material as the bank 8 for the electrolyte 10. An example is the case where both the etch mask 7 and the bank 8 are composed of Cytop, in which case the etch mask 7 does not need to be removed before the blanket deposition of the bank material 8.

Figure 8:
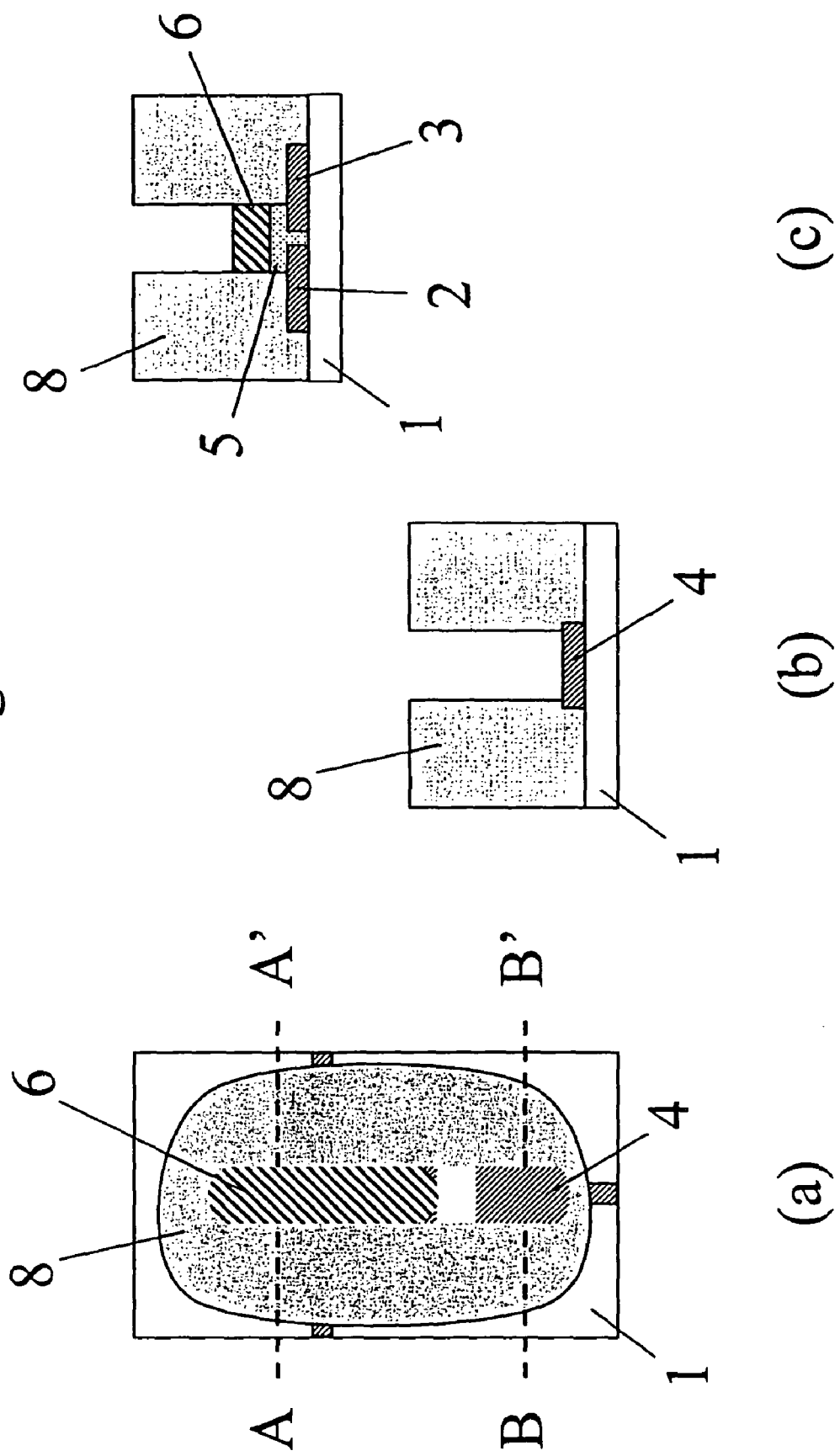
FIG. 8(a) shows a top view of an eighth stage in manufacturing a transistor according to an embodiment of the present invention.
FIG. 8(b) shows a cross section along the line B-B' in FIG. 8(a).
FIG. 8(c) shows a cross section along the line A-A' in FIG. 8(a).

FIG. 8 shows a top view (a) and two cross sections along the lines B-B' (b) and A-A' (c) of an eighth stage in manufacturing the transistor. FIG. 8 shows the device of FIG. 7 after an eighth manufacturing step, in which the bank material 8 is inkjet etched along a line stretching from the gate electrode 4 over the transistor channel as defined by the source 2 and drain 3 electrodes. The inkjet etching process is described further below. The resulting opening in the bank structure exposes the bi-layer pattern comprising the gelling agent 6 and the semiconductor 5 on top of the transistor channel, and also exposes a part of the gate electrode 4.

Inkjet etching is a process of patterning a layer of a soluble material by depositing successive droplets of a solvent onto the surface of the layer. Etching occurs as a consequence of the dissolution of the soluble material at the location of droplet impact, followed by the re-deposition of the previously dissolved material in a ring along the outer perimeter of the drying droplets.

Initially, when a first droplet of solvent is inkjet printed onto the layer of soluble material, the droplet tends to spread laterally, and soluble material from the area that is covered by the solvent droplet starts to dissolve in the solvent droplet. As the concentration of dissolved material in the droplet increases, the rate of dissolution slows down.

In addition, as the solvent evaporates, the concentration of soluble material dissolved in the droplet increases further and reaches saturation, whereupon a ring composed of the material previously dissolved from the layer of soluble material starts to build up around the edge of the drying droplet. This is due to the dissolved material being carried to, and deposited at, the outer perimeter of the drying droplet by a radial microfluid-flow. This fluid flow results from the evaporation rate at the droplet edge being faster than the evaporation rate above the centre of the drying droplet.

Successive droplets of solvent are then deposited into the ring created by the deposition of the first droplet, which acts to contain the successive droplets and prevent lateral spread of the solvent. These successive droplets etch further into the layer of soluble material. As the solvent evaporates, the height of the ring deposited around the outer perimeter increases. The process continues until the layer of soluble material is etched through to expose an area of the underlying material, e.g. the substrate 1, the layer of gelling agent 6 and the gate electrode 4 shown in FIG. 8.

In case of the fluoropolymer Cytop (supplied by Asahi Glass Inc., Japan) being used as a bank material 8, inkjet etching requires a perfluorinated solvent such as perfluorotributylamine (supplied by Sigma Aldrich), or a mixture of Fluorinert FC-75 and Fluorinert FC-70 (both supplied by Fluorochem Ltd., UK).

Figure 9:
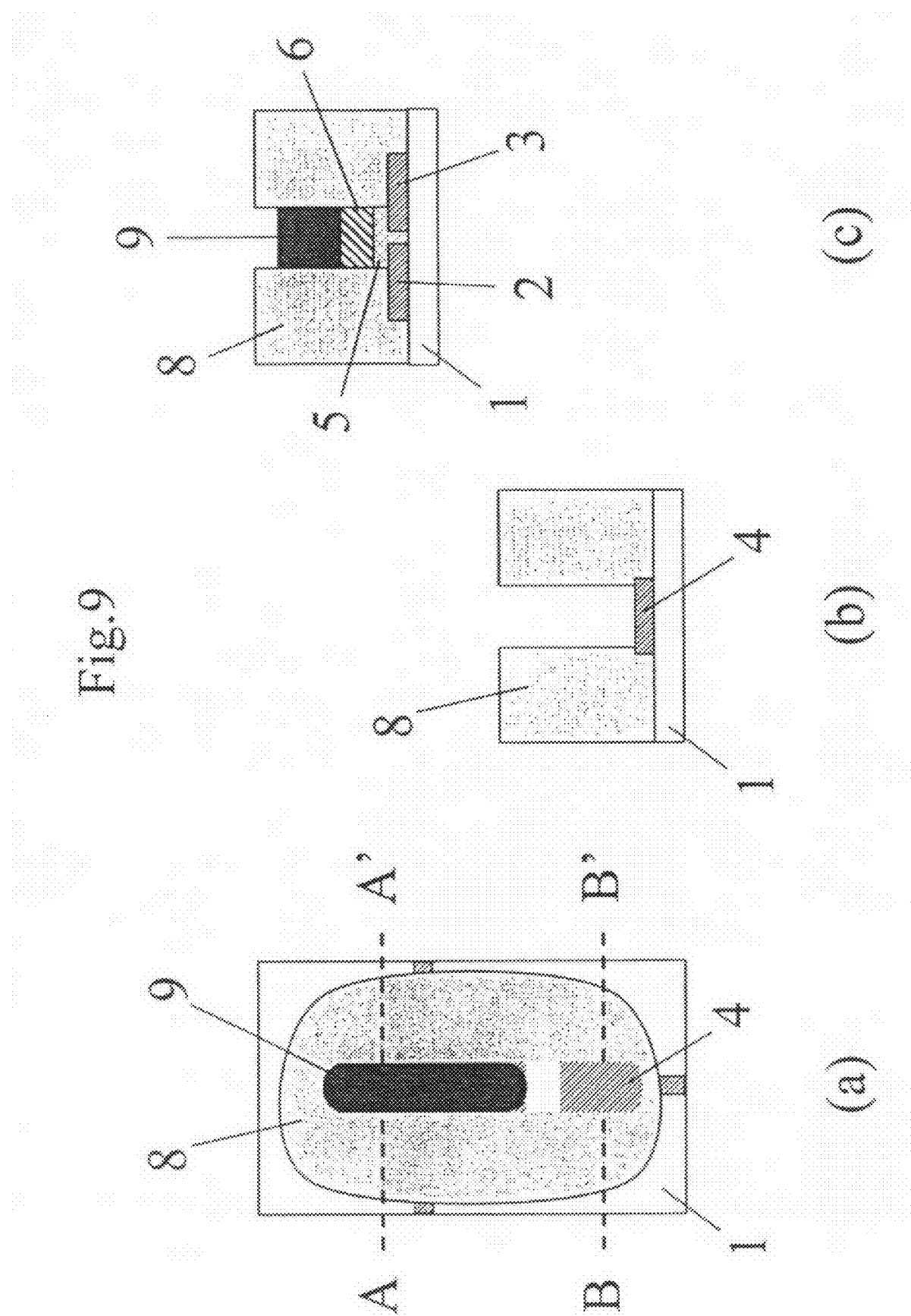
FIG. 9(a) shows a top view of a ninth stage in manufacturing a transistor according to an embodiment of the present invention.
FIG. 9(b) shows a cross section along the line B-B' in FIG. 9(a).
FIG. 9(c) shows a cross section along the line A-A' in FIG. 9(a).

FIG. 9 shows a top view (a) and two cross sections along the lines B-B' (b) and A-A' (c) of a ninth stage in manufacturing the transistor. FIG. 9 shows the device of FIG. 8 after a ninth manufacturing step, in which an electrolyte precursor 9 is inkjet printed onto the bi-layer pattern comprising the gelling agent 6 and the semiconductor 5, in the channel formed in the bank material 8.

The purpose of the electrolyte precursor 9 is to interact with the gelling agent 6 at the bottom of the electrolyte bank structure to form a pattern of gelled electrolyte 10.

In this embodiment, the electrolyte precursor 9 is inkjet printed into the bank structure. In this case the electrolyte precursor 9 must be a liquid with a viscosity and surface tension that is suitable for ejection from an inkjet head. However, in the case of electrolytes based on ionic liquids, the inherent viscosity of ionic liquids is usually far too large to allow inkjet printing. Hence, to form an ionic liquid electrolyte 10 by inkjet printing, a mixture of the ionic liquid and a suitable solvent is inkjet printed instead of the pure ionic liquid. However, in the case of an ionic liquid with a viscosity suitable for inkjet printing, the ionic liquid may be inkjet printed without an added solvent.

The following factors should be considered in selecting materials to form an ionic liquid electrolyte 10 by inkjet printing. The solvent and the concentration of the ionic liquid should be chosen such that the mixture displays a viscosity and surface tension that is suitable for inkjet printing. The solvent should be capable of dissolving the gelling agent pattern 6 at the bottom of the electrolyte bank structure because the dissolution of the gelling agent 6 is required in order to form a gel. The evaporation rate of the solvent should be slower than the rate of dissolution of the gelling agent 6, so as to ensure that the gelling agent pattern 6 at the bottom of the bank structure is completely dissolved in the electrolyte precursor 9 before the solvent evaporates and the electrolyte gel 10 forms. Finally, the solvent should not dissolve or interact with the bank material 8 or the semiconductor material 5 at the bottom of the bank structure.

When the manufacturing method of the present invention is used to fabricate an electrochemical transistor (ECT) having an ionic liquid-based electrolyte 10, the ionic liquid should be chosen to display a large window of electrochemical stability, i.e. the ionic liquid should comprise cations with a low electron affinity (which are difficult to reduce), and anions with a high ionisation potential (that are difficult to oxidise). Examples of ionic liquids that are electrochemically stable in this way include triethylsulphonium bis(trifluoromethylsulfonyl)imide, N-methyl-N-trioctylammonium bis(trifluoromethylsulfonyl)imide, N-butyl-N-methylpyrrolidinium bis(trifluoromethylsulfonyl)imide, 1-ethyl-3-methylimidazolium tetrafluoroborate, 1-ethyl-3-methylimidazolium trifluoromethylsulfonate, or 1-ethyl-3-methylimidazolium bis(trifluoromethylsulfonyl)imide. All of these materials are suitable for use in the electrolyte 10 of a transistor manufactured according to the present invention.

The manufacturing method of the present invention may also be used to fabricate electrolyte-gated field-effect transistors, such as polymeric ionic liquid-gated field effect transistors (PIL-FETs). In contrast to electrochemical transistors (ECTs), the operation of electrolyte-gated field effect transistors involves no electrochemical doping of the semiconductor material 5 in the transistor channel.

The electrolyte 10 in an electrolyte-gated field-effect transistor such as a PIL-FET should therefore be chosen to display a large window of electrochemical stability. For example, the polymeric ionic liquid used to form the electrolyte 10 of a PIL-FET must only comprise cations with a low electron affinity (which are difficult to reduce), and anions with a high ionisation potential (that are difficult to oxidise).

Furthermore, in the case of a PIL-FET, the polymeric ionic liquid for the electrolyte 10 may be chosen to either comprise immobile, polymeric anions in combination with mobile cations, or immobile, polymeric cations in combination with mobile anions.

The choice of the cation/anion combination in the polymeric ionic liquid depends on the conductivity type of the semiconductor material 5 in the transistor channel of the PIL-FET. The electrochemical doping of a neutral semiconductor material 5 in the transistor channel (which should be avoided in a PIL-FET) requires the insertion of counter-ions from the electrolyte 10 into the bulk of the neutral semiconductor. Correspondingly, the de-doping of a doped semiconductor results in the release of counter-ions from the bulk of the doped semiconductor 5 into the electrolyte 10.

Specifically, p-doping (i.e. the electrochemical oxidation) of a semiconductor 5 in the transistor channel requires the insertion of anions from the electrolyte 10 into the bulk of the semiconductor 5. Therefore, in case of p-type semiconductors, the polymeric ionic liquid must not comprise any mobile anions in order to prevent the electrochemical oxidation of the semiconductor layer 5. Thus, PIL-FETs having a p-type transistor channel require an electrolyte 10 comprising immobile, polymeric anions in combination with mobile cations.

Conversely, in the case of a PIL-FET having an n-type transistor channel, the electrolyte 10 must not comprise any mobile protons or other cations in order to prevent the electrochemical reduction of the semiconductor 5 in the transistor channel. Therefore, PIL-FETs having n-type transistor channels require an electrolyte 10 comprising immobile, polymeric cations in combination with mobile anions.

A polymeric ionic liquid electrolyte 10 for a PIL-FET having a p-type transistor channel may be chosen to comprise electrochemically stable, mobile cations identical or equivalent to N-butyl-pyridinium, 1-ethyl-3-methylimidazolium, triethylsulphonium, N-methyl-N-trioctylammonium, or N-butyl-N-methylpyrrolidinium.

As for the anion component, the polymeric ionic liquid may comprise immobile poly-anions such as poly[vinylsulfonate], poly[p-styrenesulfonate], poly[vinylphosphonate], or poly[3-sulfopropyl acrylate], or poly-anionic brushes with alkyl, oligo-ethylene glycol, or oligo-propylene glycol spacers between the acid group and the polymerizable vinyl or acrylate group.

A polymeric ionic liquid electrolyte 10 for a PIL-FET having an n-type transistor channel may be chosen to comprise electrochemically stable, mobile anions identical or equivalent to tetrafluoroborate, hexafluorophosphate, trifluoromethylsulfonate, or bis(trifluoromethylsulfonyl)imide.

As for the cation component, the polymeric ionic liquid may comprise immobile poly-cations such as the poly[1-[2-(methacryloyloxy)dodecyl]-3-ethyl-imidazolium], poly[1-(p-vinylbenzyl)-3-methyl-imidazolium], poly[1-(p-vinylbenzyl)-3-butyl-imidazolium], poly[(p-vinylbenzyl) trimethyl ammonium], poly[(p-vinylbenzyl)triethyl ammonium], poly[(p-vinylbenzyl)tributyl ammonium], poly [2-(methacryloyloxy)ethyltrimethylamnonium], poly[(p-vinylbenzyl)triethyl phosphonium], poly[(p-vinylbenzyl) triphenyl phosphonium], poly[p-vinylbenzyl) pyridinium], poly[bis(2-hydroxyethyl)dimethyl ammonium], poly[2,2-bis (methylimidazolium methyl)-1,3-propanediol], or poly[2,2-bis(butylimidazolium methyl)-1,3-propanediol]cations.

Figure 10:
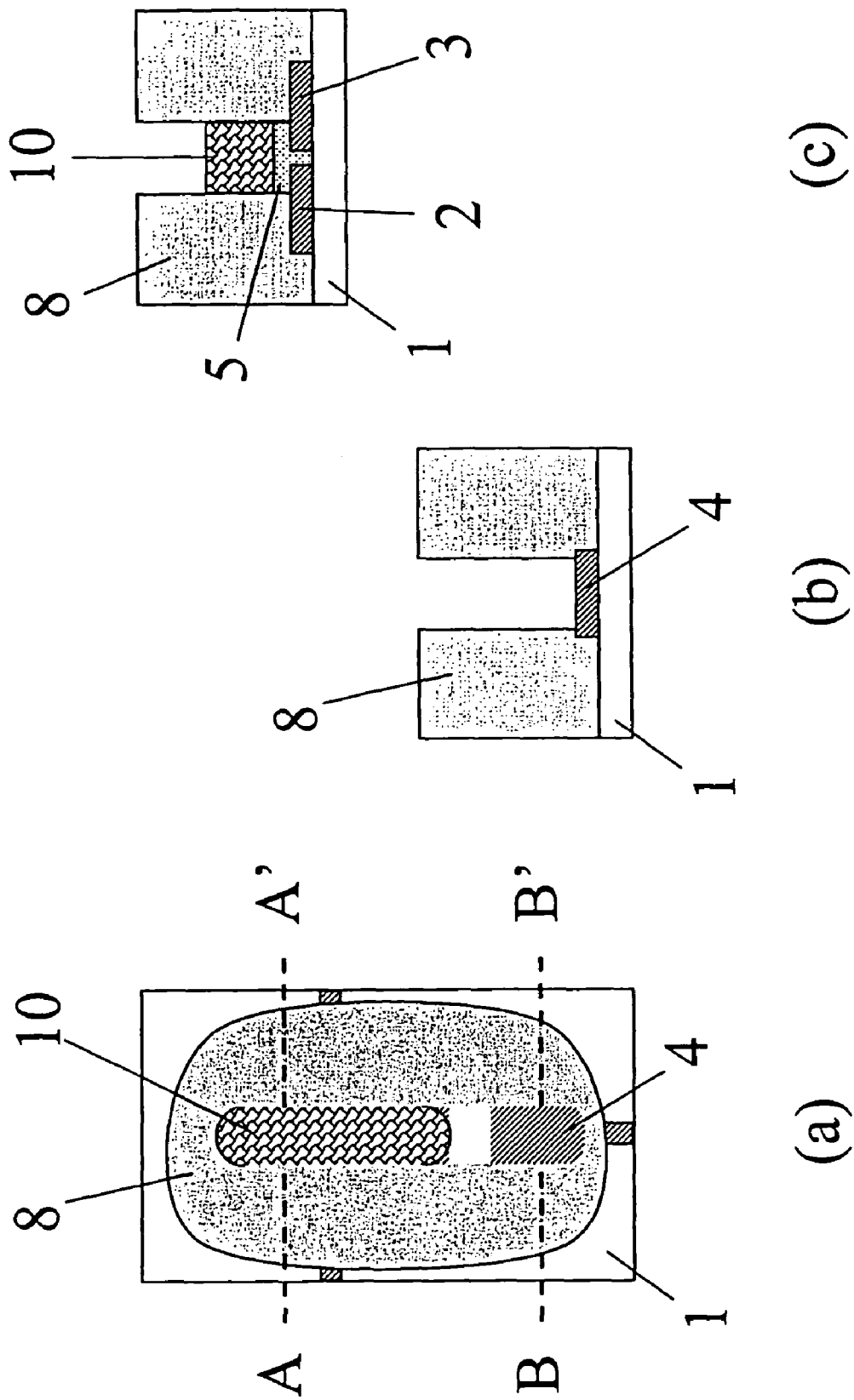
FIG. 10(a) shows a top view of a tenth stage in manufacturing a transistor according to an embodiment of the present invention.
FIG. 10(b) shows a cross section along the line B-B' in FIG. 10(a).
FIG. 10(c) shows a cross section along the line A-A' in FIG. 10(a).

FIG. 10 shows a top view (a) and two cross sections along the lines B-B' (b) and A-A' (c) of a tenth stage in manufacturing the transistor. FIG. 10 shows the device of FIG. 9 after the electrolyte precursor 9 interacts with the gelling agent 6 to form a pattern of gelled electrolyte 10 on top of the semiconductor pattern 5.

FIG. 11 shows a top view (a) and two cross sections along the lines B-B' (b) and A-A' (c) of an eleventh stage in manufacturing the transistor. FIG. 11 shows the device of FIG. 10 after a tenth manufacturing step, in which a gate electrode extension 12 is inkjet printed into the channel in the bank material 8. The gate electrode extension 12 is deposited on top of the gate electrode 4 and extends to completely cover the gelled electrolyte pattern 10.

In an electrochemical transistor (ECT), the electrochemical doping of a neutral semiconductor material in the transistor channel results in the insertion of counter-ions from the electrolyte into the bulk of the neutral semiconductor. Correspondingly, the de-doping of a doped semiconductor results in the release of counter-ions from the bulk of the doped semiconductor into the electrolyte.

Thus, in order to maintain charge neutrality within the electrolyte in an ECT, the gate electrode in the transistor either has to release an equivalent amount of anions or electrons into the electrolyte, or remove an equivalent amount of cations from the electrolyte. This exchange of ions between the semiconductor layer in the transistor channel and the electrolyte in ECTs therefore requires a complementary (i.e. opposite) redox reaction to occur at the gate electrode. Specifically, when a p-type semiconductor in the transistor channel of an ECT is doped by electrochemical oxidation, a complementary electrochemical reduction is required to occur at the gate electrode. Conversely, in case of an n-type semiconductor material forming the transistor channel of an ECT, the gate electrode must be reversibly oxidized when the transistor is switched to its ON-state.

An electrochemically active gate electrode extension 12 may be used to provide such complementary electrochemical reactions. An example of a material for such a gate electrode extension 12 is polyaniline in the emeraldine salt form, which can be both reversibly reduced to the leucoemeraldine base form and reversibly oxidized to the pernigraniline form.

In contrast, in the case of electrolyte-gated FETs such as PIL-FETs, the gate electrode extension 12 must not generate and release ions into the electrolyte 10 that would enable the semiconductor material 5 in the transistor channel to undergo electrochemical doping during switching. Electrochemically inert materials such as carbon black are therefore suitable for the inkjet printed gate electrode extension 12 in PIL-FETs manufactured according to the present invention.

FIG. 12 shows a top view (a) and two cross sections along the lines B-B' (b) and A-A' (c) of a twelfth stage in manufacturing the transistor. FIG. 12 shows the device of FIG. 11 after an eleventh manufacturing step, in which an encapsulation layer 13 is deposited onto the bank structure 8 and the gate electrode extension 12.

The encapsulation layer 13 should fulfill the same requirements as the bank material 8, i.e. it should be insoluble in the electrolyte 10, be non-polar in order to prevent ion diffusion, and display extremely small diffusion coefficients for ions and water molecules, as outlined above in the discussion of FIG. 7.

The encapsulation layer 13 may therefore be chosen to comprise the same material as the bank structure 8. Possible materials for the encapsulation layer 13 include the fluoropolymer Cytop (supplied by Asahi Glass Inc., Japan) and the cycloolefin copolymer Zeonex (supplied by Zeon Corporation, Japan). Both Cytop and Zeonex are chemically resistant, display small dielectric constants (2.1 and 2.2-2.3, respectively) and absorb less than 0.01% water.

EXAMPLE

The following is a preferred embodiment of the manufacturing method and the resulting transistor according to the present invention. In a first step, source, drain, and gate electrodes are patterned from an evaporated gold layer on a glass substrate. The source and drain electrodes are separated so as to define a transistor channel between them. The channel length L is 20 μm, and the width W is 1 mm. The gate electrode is positioned laterally to the source-drain electrode pair, at a distance of 1 mm.

A thin layer (40 nm thick) of the semiconducting polymer ADS2008 (supplied by American Dye Source Inc., Canada) is then spin-coated onto the substrate from a 1% toluene solution and annealed in air. Annealing is performed at a temperature of 80 deg. C. for 10 minutes.

A layer (600 nm thick) of the gelling agent poly(methylmethacrylate) (PMMA) is spin-coated onto the semiconductor layer from a 6% butylacetate solution and annealed in air. Again, annealing is performed at a temperature of 80 deg. C. for 10 minutes.

An etch mask pattern consisting of the fluoropolymer Cytop is inkjet printed onto the PMMA gelling layer, on top of the transistor channel. The Cytop ink comprises Cytop dissolved in a mixture of perfluorotributylamine, FC-70 (supplied by Fluorochem Ltd., UK), and FC-75 (supplied by Fluorochem Ltd., UK). The resulting layer thickness of the etch mask depends on the Cytop concentration in the ink, the droplet spacing, and the number of inkjet printing passes. A layer thickness of at least 200 nm of Cytop is formed over the centre of the transistor channel in this embodiment, in order to provide a reliable etch mask for the ensuing oxygen plasma patterning step.

An oxygen plasma treatment is then performed to pattern the gelling agent layer and the semiconductor layer. The PMMA gelling agent layer and the ADS2008 semiconductor layer are removed everywhere, except in those areas that are covered by the inkjet printed Cytop etch mask.

A thick layer of Cytop bank material is spin-coated onto the substrate, covering the source, drain, and gate electrodes and the Cytop/PMMA/ADS2008 multilayered patterns. The thickness of the bank material determines the depth of the resulting bank structure and can be increased by multiple spin-coating steps in combination with intermediate annealing sequences. There is no need to remove the Cytop etch mask from the multilayer patterns prior to the deposition of the Cytop bank layer, as the etch mask material will be removed during the ensuing patterning of the thick Cytop bank layer by inkjet etching.

The Cytop bank layer is then patterned by inkjet etching. Droplets of a suitable solvent mixture are deposited in multiple passes along a line stretching from the gate electrode over the transistor channel defined by the source and drain electrodes. The number of passes required depends on the thickness of the Cytop bank layer. Inkjet etching in this embodiment is performed using a perfluorinated solvent such as perfluorotributylamine, 3M Fluorinert FC-75, or 3M Fluorinert FC-70. The resulting opening in the bank structure exposes the bi-layer pattern comprising the PMMA gelling layer and the ADS2008 semiconductor on top of the transistor channel, and also exposes a part of the gold gate electrode.

Next, an electrolyte precursor comprising a 10% vol/vol mixture of ethyl-methyl-imidazolium bis(trifluoromethyl)sulfonylimide (EMI-TFSI; supplied by Toyo Gosei Inc., Japan) in benzylalcohol is inkjet printed onto the PMMA gelling agent pattern via the opening in the bank structure.

Following printing of the electrolyte precursor, the electrolyte precursor interacts with the gelling agent. Initially, the benzylalcohol component in the electrolyte precursor dissolves the PMMA gelling agent. Then, the evaporation of the benzylalcohol component of the electrolyte precursor results in the formation of a pattern of EMI-TFSI/PMMA gel on top of the ADS2008 semiconductor pattern.

A gate electrode extension is then formed by inkjet printing a polyaniline emeraldine salt solution in an aromatic solvent on top of the gate electrode and along the opening in the Cytop bank to completely cover the EMI-TFSI/PMMA gel pattern.

The transistor is completed by spin-coating a thick Cytop encapsulation layer onto the device so as to cover the bank structure and the gate electrode extension.

The method according to the present invention allows a gel electrolyte pattern to be formed by inkjet printing a liquid material, which is much easier than depositing a gel material directly. In addition to preventing leakage, the gelling of the electrolyte allows other layers such as a gate electrode to be deposited on top of the electrolyte layer without the risk of creating short circuits with layers beneath the gel electrolyte pattern.

The gel electrolyte patterns according to the present invention can be manufactured simply by depositing an electrolyte precursor, which is typically a liquid material, onto a gelling agent. This process is easier to perform than a process involving depositing a gel electrolyte directly, particularly when used in the manufacture of a device such as an electrochemical transistor or an electrochromic display.

The preferred embodiment of the invention provides a structure for electrolyte-gated transistors in which the electrolyte layer is sandwiched vertically between the transistor channel and a top-gate electrode extension. In such a device structure, the distance between the extended gate electrode and the transistor channel is minimized, which maximizes the ionic conductance between the transistor channel and the gate electrode. The structure thereby provides fast switching speeds and reduced hysteresis. The transistor structure of the invention is suitable for being manufactured using inkjet printing and other solution-based processes, which allows the transistor according to the invention to be fabricated reliably, quickly and inexpensively. Furthermore, the invention provides a manufacturing method for producing the transistor structure. The method according to the invention provides a reliable and quick manufacturing process for an electrolyte-gated transistor.

Furthermore, the invention provides a combination of a bank structure and an encapsulation layer, which efficiently contains the electrolyte of the transistor and prevents the diffusion of ions out of the electrolyte.

In addition to enclosing the electrolyte within the bank structure and the encapsulation layer, the transistor structure of the invention prevents leakage of the electrolyte by providing a pattern of gelled, rather than liquid, electrolyte. By using a gelling agent layer and a separate electrolyte precursor that interacts with the gelling agent layer, the method of the invention allows a gelled electrolyte to be formed using solution processes, in particular inkjet printing.

Another effect of the gelling of the electrolyte is to allow a gate electrode extension to be printed onto the top surface of the electrolyte pattern without the risk of creating a short circuit with the semiconductor in the transistor channel below the electrolyte.

Finally, the invention allows a constant ionic conductivity to be maintained in the electrolyte of the transistor by preventing both the loss of water or volatile organic solvents from the electrolyte due to evaporation, and the absorption of water from the environment by the electrolyte. The invention avoids these problems because both the bank structure and the encapsulation layer are chosen to comprise barrier materials with extremely low diffusion coefficients for water and/or organic solvent molecules.

The aforegoing description has been given by way of example only and it will be appreciated by a person skilled in the art that modifications can be made without departing from the scope of the present invention.

In particular, while the method and the gel electrolyte pattern of the present invention have been described in the context of a transistor, the present invention can be applied equally to any other device using an electrolyte, for example an electrochromic display.

What is claimed is:

1. A method of forming a transistor, the method comprising:
    forming a gate electrode, a source electrode and a drain electrode over a substrate;
    forming a semiconductor material at least between the source electrode and the drain electrode;
    forming a bank structure having an opening above the semiconductor material and the gate electrode;
    forming an electrolyte inside the opening, the electrolyte being formed on the semiconductor material and being separated from the gate electrode; and
    forming a gate electrode extension electrically connected to the electrolyte and the gate electrode.

2. The method of forming a transistor according to claim 1, the forming of the bank structure comprising:
    forming a bank layer so as to cover the semiconductor material; and
    forming the opening through the bank layer.

3. The method of forming a transistor according to claim 1, the forming of the electrolyte comprising:
    forming a gelling agent layer on the semiconductor material, the gelling agent layer including a gelling agent; and
    forming an electrolyte precursor onto the gelling agent layer, the gelling agent and the electrolyte precursor being selected such that the electrolyte precursor interacts with the gelling agent to form the electrolyte.

4. The method of forming a transistor according to claim 3, the forming of the bank structure comprising:
    forming a bank layer so as to cover the gelling agent layer after the gelling agent layer is formed; and
    forming the opening through the bank layer before the electrolyte precursor is formed.

5. The method of forming a transistor according to claim 3, the forming of the gelling agent layer comprising:
    depositing an unpatterned gelling agent layer onto the semiconductor material; and
    patterning the semiconductor material and the unpatterned gelling agent layer.

6. The method of forming a transistor according to claim 3, the gelling agent layer including PVDF-HFP or PMMA.

7. The method of forming a transistor according to claim 3, the gelling agent layer including nano-particles.

8. The method of forming a transistor according to claim 3, the electrolyte precursor being configured to dissolve the gelling agent layer.

9. The method of forming a transistor according to claim 3, the electrolyte precursor being configured to disperse the gelling agent layer.

10. The method of forming a transistor according to claim 1, the gate electrode extension being deposited by inkjet printing.

11. The method of forming a transistor according to claim 10, the forming of the electrolyte comprising:
    forming a gelling agent layer on the semiconductor material, the gelling agent layer including a gelling agent; and
    forming an electrolyte precursor onto the gelling agent layer, the gelling agent and the electrolyte precursor being selected such that the electrolyte precursor interacts with the gelling agent to form the electrolyte.

12. The method of forming a transistor according to claim 10, the forming of the electrolyte comprising:
    forming a gelling agent layer on the semiconductor material, the gelling agent layer including a gelling agent;
    forming a bank layer so as to cover the gelling agent layer;
    forming the opening through the bank layer; and
    forming an electrolyte precursor onto the gelling agent layer, the gelling agent and the electrolyte precursor being selected such that the electrolyte precursor interacts with the gelling agent to form the electrolyte.

13. A method of forming a transistor having a gate electrode, a source electrode, a drain electrode, a semiconductor material, an electrolyte and a bank structure, the semiconductor material being disposed at least between the source electrode and the drain electrode, the bank structure having an opening above the semiconductor material and the gate electrode, the method comprising:
    forming a gate electrode extension on the electrolyte and on the gate electrode by inkjet method.

* * * * *